(12) United States Patent
Stephens et al.

(10) Patent No.: US 7,745,298 B2
(45) Date of Patent: Jun. 29, 2010

(54) METHOD OF FORMING A VIA

(75) Inventors: Tab A. Stephens, Buda, TX (US);
Olubunmi O. Adetutu, Austin, TX (US); Paul A. Grudowski, Austin, TX (US); Matthew T. Herrick, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 241 days.

(21) Appl. No.: 11/948,209

(22) Filed: Nov. 30, 2007

(65) Prior Publication Data

US 2009/0142895 A1 Jun. 4, 2009

(51) Int. Cl.
*H01L 21/336* (2006.01)
(52) U.S. Cl. ................ 438/303; 438/655; 257/E21.619
(58) Field of Classification Search .................. 438/299, 438/300, 303, 655, 664; 257/E21.619
See application file for complete search history.

(56) References Cited

U.S. PATENT DOCUMENTS

| 6,165,880 | A | 12/2000 | Yaung et al. | |
| 6,184,073 | B1 | 2/2001 | Lage et al. | |
| 6,369,420 | B1 | 4/2002 | Yeh et al. | |
| 6,737,308 | B2 * | 5/2004 | Kim | 438/197 |
| 2006/0099729 | A1 * | 5/2006 | Yang | 438/40 |

* cited by examiner

*Primary Examiner*—Thanhha Pham
(74) *Attorney, Agent, or Firm*—James L. Clingan, Jr.; Joanna G. Chiu

(57) ABSTRACT

A method for forming a via includes forming a gate electrode over a semiconductor substrate, forming a source/drain region in the semiconductor substrate adjacent the gate electrode, forming a silicide region in the source/drain region, forming a post-silicide spacer adjacent the gate electrode after forming the silicide region, forming an interlayer dielectric layer over the gate electrode, the post-silicide spacer, and the silicide region, and forming a conductive via in the interlayer dielectric layer, extending to the silicide region.

4 Claims, 9 Drawing Sheets

METHOD OF FORMING A VIA

BACKGROUND

1. Field

This disclosure relates generally to semiconductor devices, and more specifically, to forming vias in semiconductor devices.

2. Related Art

In typical semiconductor structures, gate electrodes are formed over semiconductor layers and source/drains are formed adjacent to the gates in the semiconductor layers. In many cases two adjacent gate electrodes are close together and share a source/drain region. Contacting the source/drain region involves forming a via hole through an interlayer dielectric and between the gates to expose the source/drain region. There is a tension between the desirability of placing adjacent gate electrodes close together to optimize usage of the available space and making adjacent gate electrodes far enough apart to reliably accommodate the via between them. One difficulty is aligning the via to the source/drain region between the gate electrodes that are close together. In forming the via hole, the misalignment can result in excessive etching into the sidewall spacer on one of the gate electrodes which can result in reliability problems and altered transistor performance. As critical dimensions continue to scale, this issue becomes more problematic.

Thus, there is a need for a method that provides an improvement in forming vias to source/drain regions in which the via is close to the gate electrode.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a gate electrode has a first sidewall spacer useful in forming a source/drain region. After source/drain region formation, a silicidation process results in a silicide region on the source/drain region that is useful for making a contact. After silicidation, an additional sidewall spacer is formed of a different material from the first sidewall spacer. An interlayer dielectric (ILD) is formed over the silicide region, and an etch is performed to form a via hole to the source/drain region through the ILD. The first sidewall spacer is protected by the additional sidewall spacer during the etch. Thus, the subsequent via formation is into a via hole in which the first sidewall spacer is protected.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
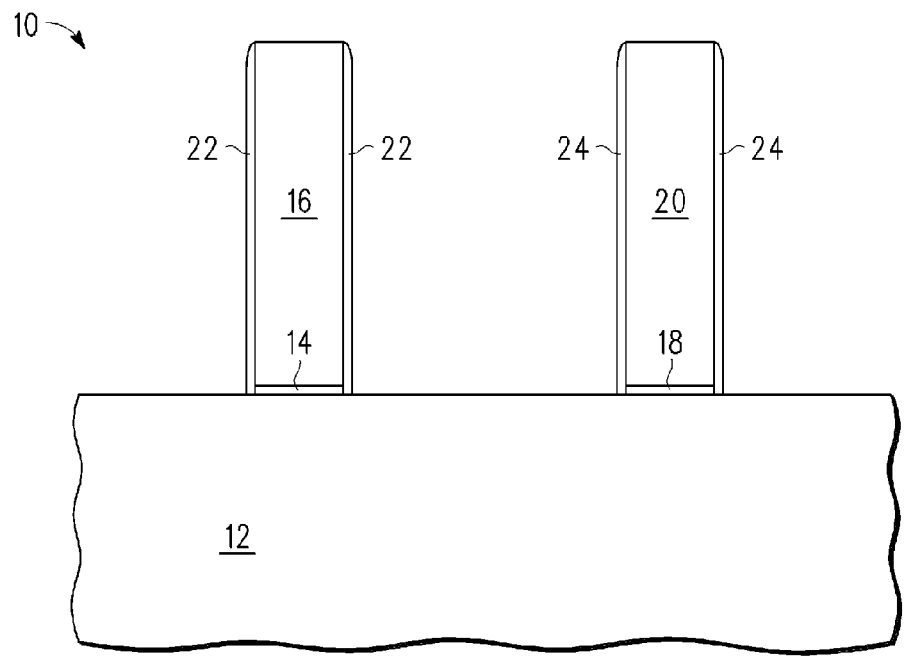
FIG. 1 is semiconductor device structure at a stage in processing according to one embodiment.

Shown in FIG. 1 is a semiconductor device 10 having a semiconductor layer 12 as a top portion of a semiconductor substrate, a gate dielectric 14 on semiconductor layer 12, a gate electrode 16 on gate dielectric 14, a gate dielectric 18 on semiconductor layer, a gate electrode 20 on gate dielectric 18, a sidewall spacer 22 around gate electrode 16, and a sidewall spacer 24 around gate electrode 20. Gate dielectrics 14 and 18 may be oxide, which is very common for a gate dielectric, or another material such as a high k dielectric. One example of a high k dielectric is hafnium oxide. There are other examples, often including a metal oxide. Gate electrodes may be polysilicon or a stack of materials that include a metal or metals and may or may not further include polysilicon. In this example, gate electrodes 16 and 20 may be about 300 nanometers (nm) in height and have their centers about the same distance apart. The distance the centers are apart is commonly called the pitch. For a given technology the minimum pitch is often the same as the gate electrode height. Thus, for the minimum pitch situation, the distance between gate electrode centers is no more than the height of the gate electrodes. Sidewall spacers 22 and 24 may be oxide and be about 20 nm thick.

Figure 2:
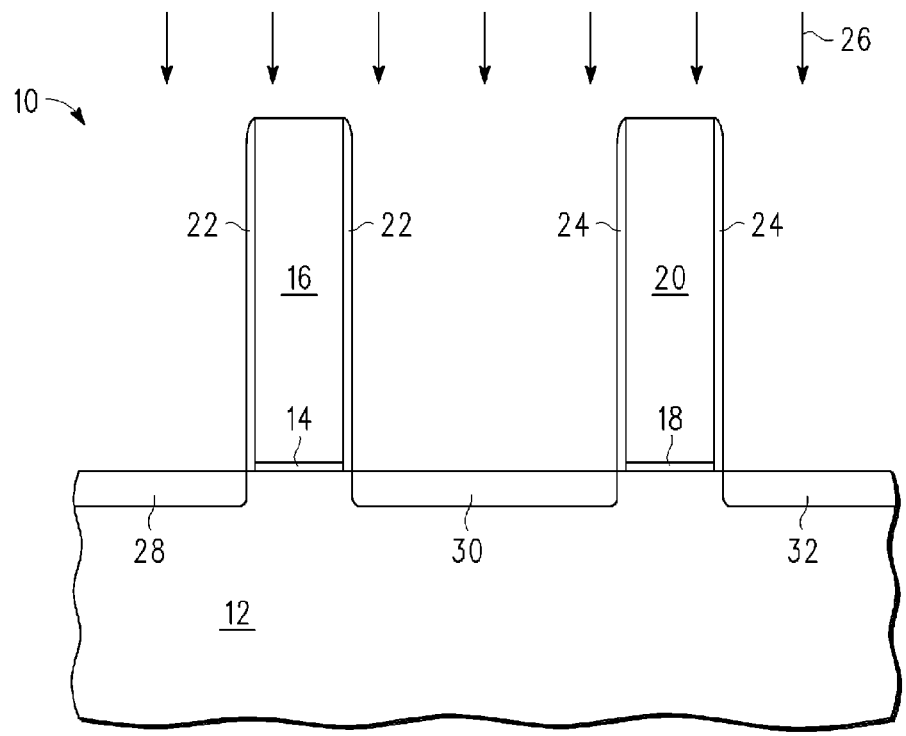
FIG. 2 is the semiconductor device structure of FIG. 1 at a subsequent stage in processing.

Shown in FIG. 2 is semiconductor device 10 after an implant 26 which results in source/drain extension 28 in semiconductor layer 12 adjacent to gate electrode 16 on a side of gate electrode 16 away from gate electrode 20, source/drain extension 30 between gate electrodes 20 and 16, and source/drain extension 32 on a side of gate electrode 20 away from gate electrode 16. Gate electrodes 16 and 20 and sidewall spacers 22 and 24 act as masks during implant 26. Additional implants for other purposes than source/drain formation may also be performed at this stage. One example is that a halo implant may be performed. Implant 36 may be an implant of boron for forming p channel transistors and phosphorus and/or arsenic for forming n channel transistors. Gate electrodes 16 and 20 are also doped by implant 36. While not shown in the figure, additional masking layers may be used to separately form source/drain extensions 28, 30, and 32.

Figure 3:
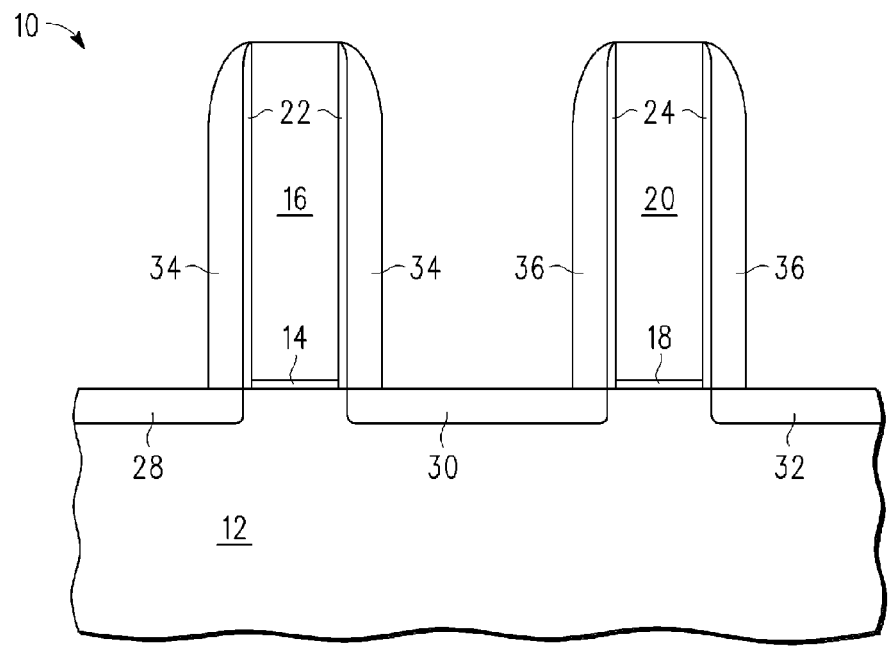
FIG. 3 is the semiconductor device structure of FIG. 2 at a subsequent stage in processing.

Shown in FIG. 3 is semiconductor device 10 after forming a sidewall spacer 34 around gate electrode 16 and a sidewall spacer 36 around gate electrode 20. Sidewall spacers 34 and 36 may be of nitride and about 40 nm wide.

Figure 4:
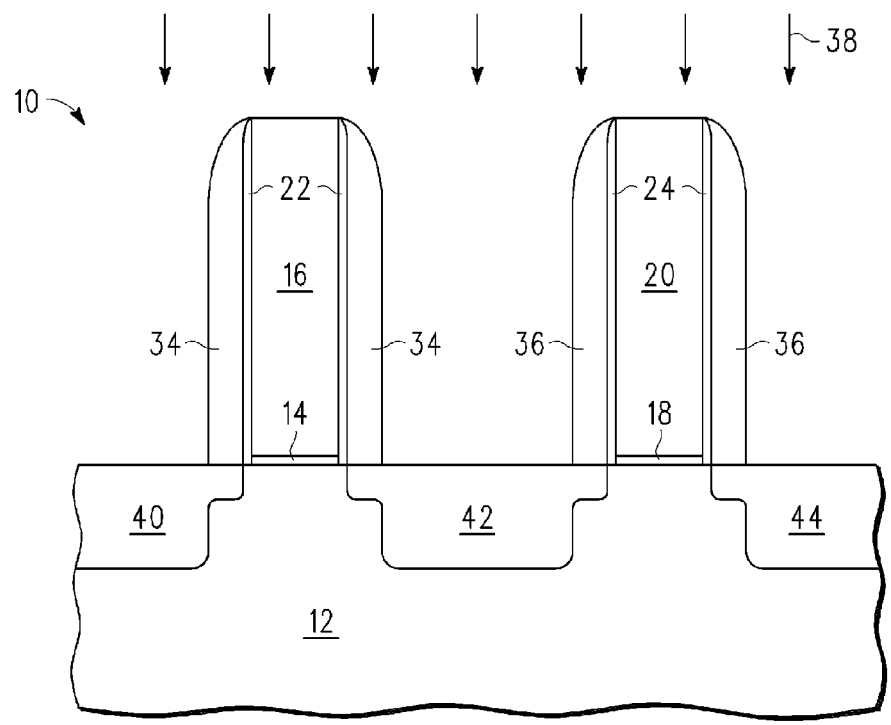
FIG. 4 is the semiconductor device structure of FIG. 3 at a subsequent stage in processing.

Shown in FIG. 4 is semiconductor device 10 after an implant 38 that is a heavier and deeper implant than implant 26. This implant is for completing the doping for transistor formation and form source/drain region 40 in semiconductor layer 12 adjacent to gate electrode 16 on the side of gate electrode 16 away from gate electrode 20, source/drain region 42 between gate electrodes 20 and 16, and source/drain region 44 on the side of gate electrode 20 away from gate electrode 16. In addition to gate electrodes 16 and 20 and sidewall spacers 22 and 24, sidewall spacers 34 and 36 act as a mask during implant 38. Implant 38 may be the same dopant type as chosen for implant 26. Gate electrodes 16 and 20 are also doped by implant 38. While not shown in the figure, additional masking layers may be used to separately form source/drain extensions 40, 42, and 33.

Figure 5:
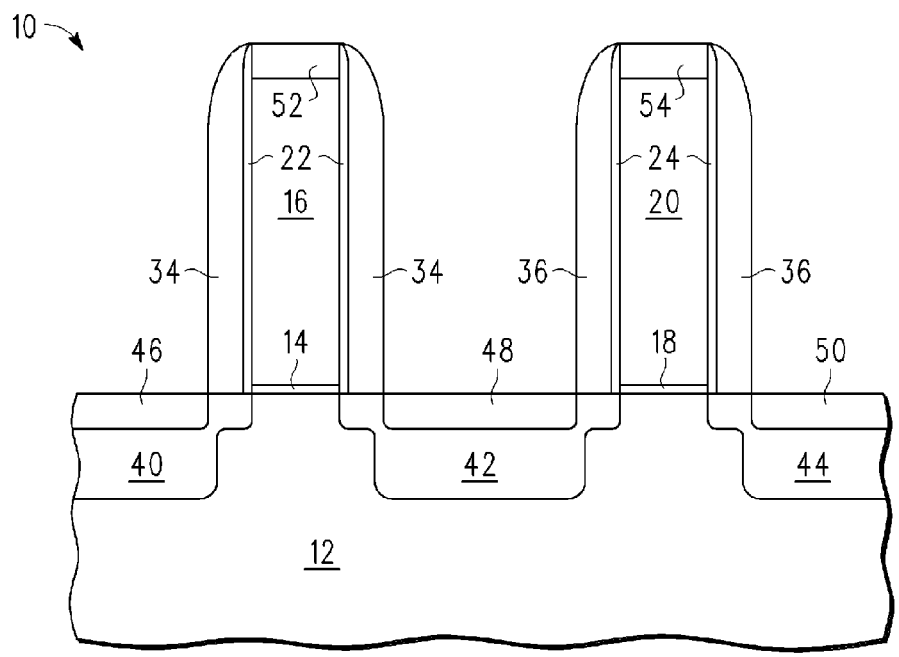
FIG. 5 is the semiconductor device structure of FIG. 4 at a subsequent stage in processing.

Shown in FIG. 5 is semiconductor device 10 after performing a heating step and forming a silicide region 46 on source drain region 40 and adjacent to sidewall spacer 34, a silicide region 48 over source/drain region 42 and bounded by sidewall spacers 34 and 36, a silicide region 50 over source/drain region 44 and adjacent to sidewall spacer 36, a silicide region 52 on gate electrode 16, and a silicide region 54 on gate electrode 20. The heating step causes some outward diffusion of source/drain regions 40, 42, and 44 as well as activating implants 26 and 38. Silicide regions 46, 48, and 50 may be cobalt silicide. Other commonly used suicides that may be effective include nickel silicide or tungsten silicide. Other suicides may be effective as well.

Figure 6:
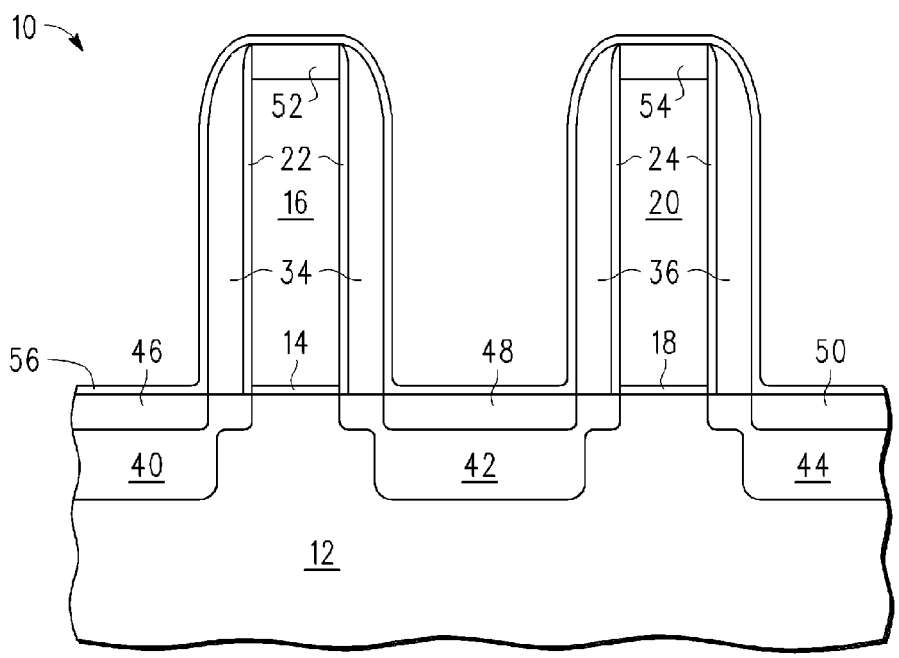
FIG. 6 is the semiconductor device structure of FIG. 5 at a subsequent stage in processing.

Shown in FIG. 6 is semiconductor device 10 after forming an insulating layer 56 over silicide regions 46, 48, 50, 52, and 54; sidewall spacers 34 and 36; and sidewall spacers 22 and 24. Insulating layer 56 is conformal and preferably a different material from that of sidewall spacers 34 and 36 so as to have a different etch characteristic. For this example, sidewall spacers 34 and 36 are nitride so that insulating layer 56 may be oxide. An etch chemistry effective in etching nitride can be very selective to oxide. Either tetraethyorthosilicate glass (TEOS) or silane-based oxide can be used for insulating layer 56. Insulating layer 56 may be 20 nm thick. Because of the high selectivity of oxide to chosen etchants of nitride, insulating layer 56 can be relatively thin.

Figure 7:
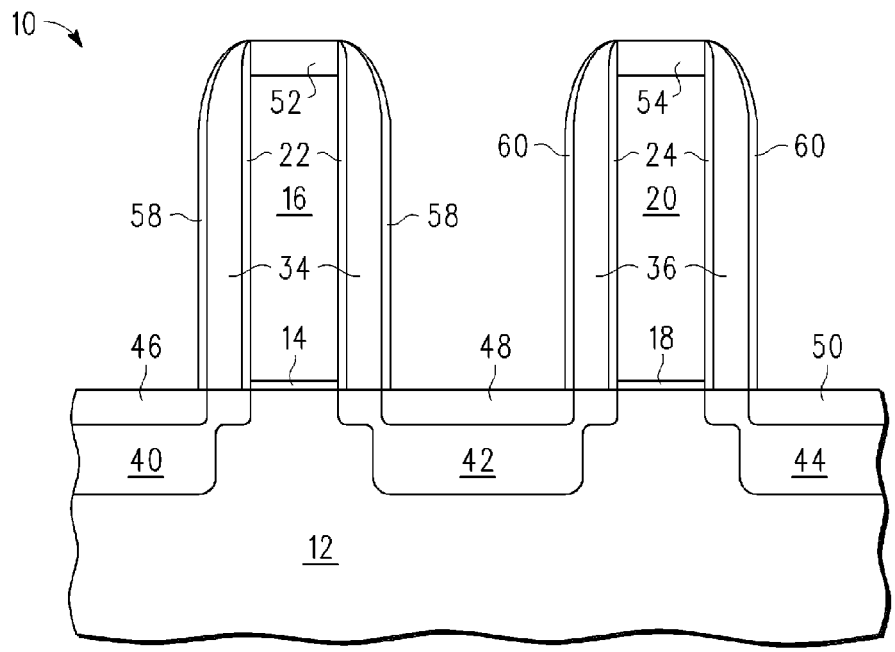
FIG. 7 is the semiconductor device structure of FIG. 6 at a subsequent stage in processing.

Shown in FIG. 7 is semiconductor device 10 after an anisotropic etch that removes insulating layer 56 from over silicide regions 46, 48, 50, 52, and 54 leaving a sidewall spacer 58 around sidewall spacer 34 and a sidewall spacer 60 around sidewall spacer 36. As an alternative, sidewall spacers 34 and 36, and perhaps sidewall spacers 22 and 24, could be removed prior to the formation of insulating layer 56. If sidewall spacers 34 and 36 were removed prior to forming insulating layer 56, then it would be desirable for insulating layer 56 to be thicker than 20 nm. In either case sidewall spacers 58 and 60 would be considered to be post-silicide sidewall spacers adjacent to gate electrodes 16 and 20, respectively because only pre-silicide spacers, if any, would be between sidewall spacers 58 and 60 and gate electrodes 16 and 20, respectively.

Figure 8:
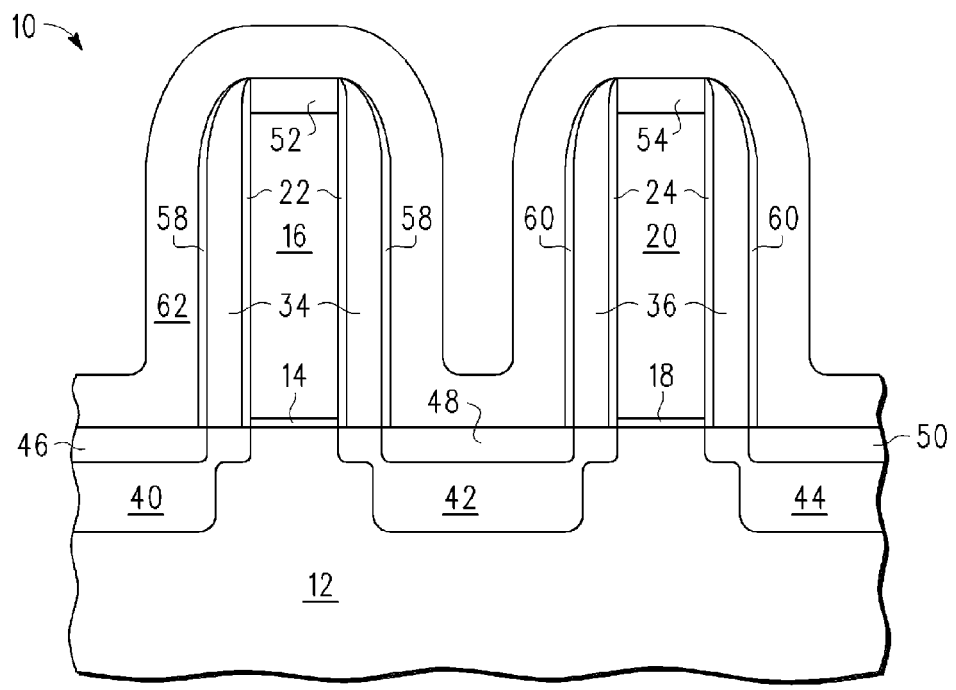
FIG. 8 is the semiconductor device structure of FIG. 7 at a subsequent stage in processing.

Shown in FIG. 8 is semiconductor device 10 after forming an etch stop layer 62 over silicide regions 46, 48, 50, 52, and 54; sidewall spacers 34 and 36; sidewall spacers 22 and 24; and sidewall spacers 58 and 60. Etch stop layer 62 may be nitride and be about 50 nm thick. Etch stop layer 62 may also be used as a stress or layer to enhance transistor performance.

Figure 9:
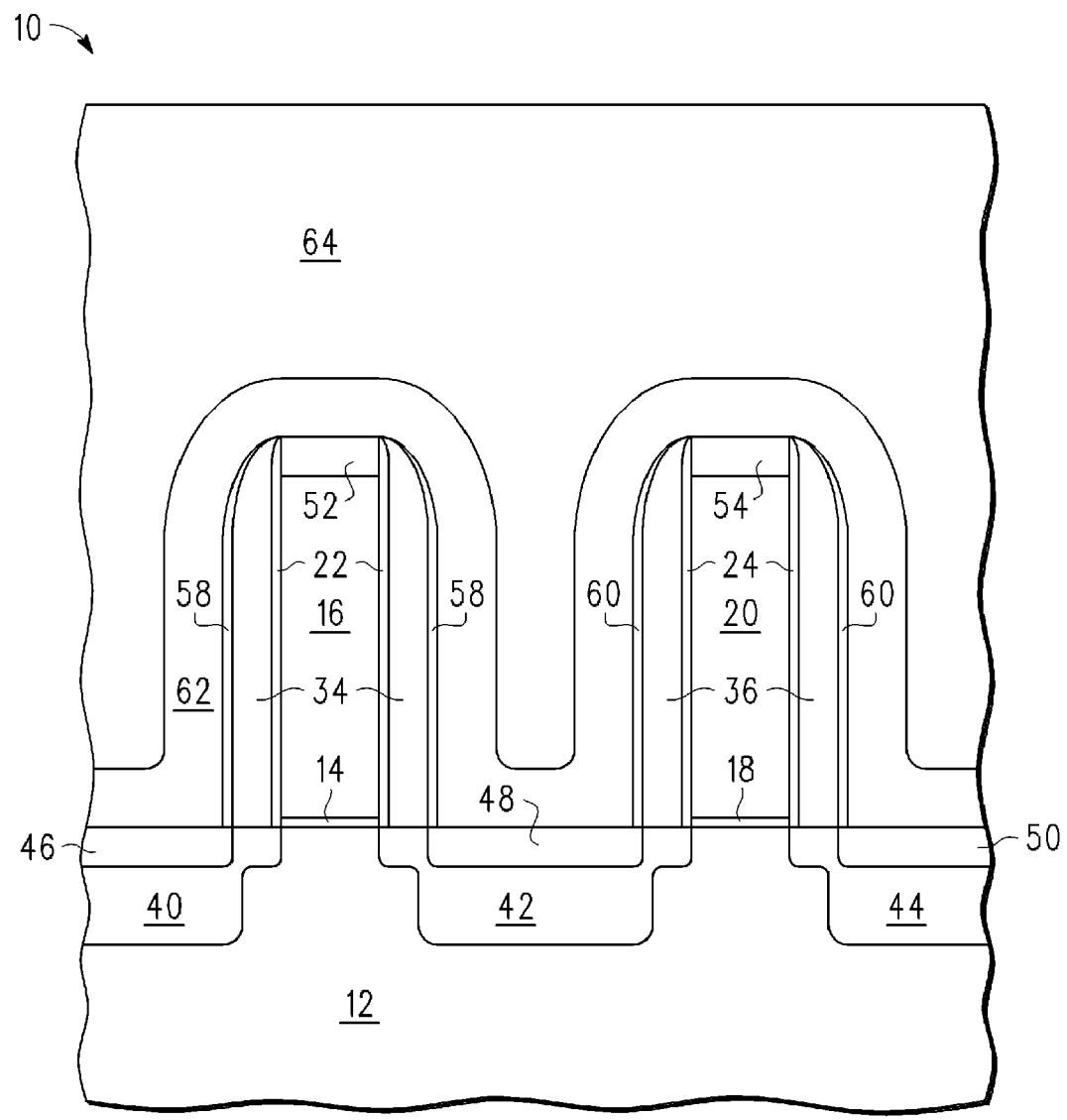
FIG. 9 is the semiconductor device structure of FIG. 8 at a subsequent stage in processing.

Shown in FIG. 9 is semiconductor device 10 after depositing and then chemical mechanical polishing (CMP) an interlayer dielectric layer 64. Interlayer dielectric 64 may be oxide and may be formed using TEOS as well as other techniques such as doped oxide, undoped oxide, or doped silicate glass. Interlayer dielectric 64 may also be a stack that includes more than one film to improve the filling characteristics between the gate electrodes 16 and 20. The thickness of interlayer dielectric 64 shown is about twice that of the height of gate electrodes 16 and 20. This may vary. For example, it may just one and half times the height of the gate electrodes.

Figure 10:
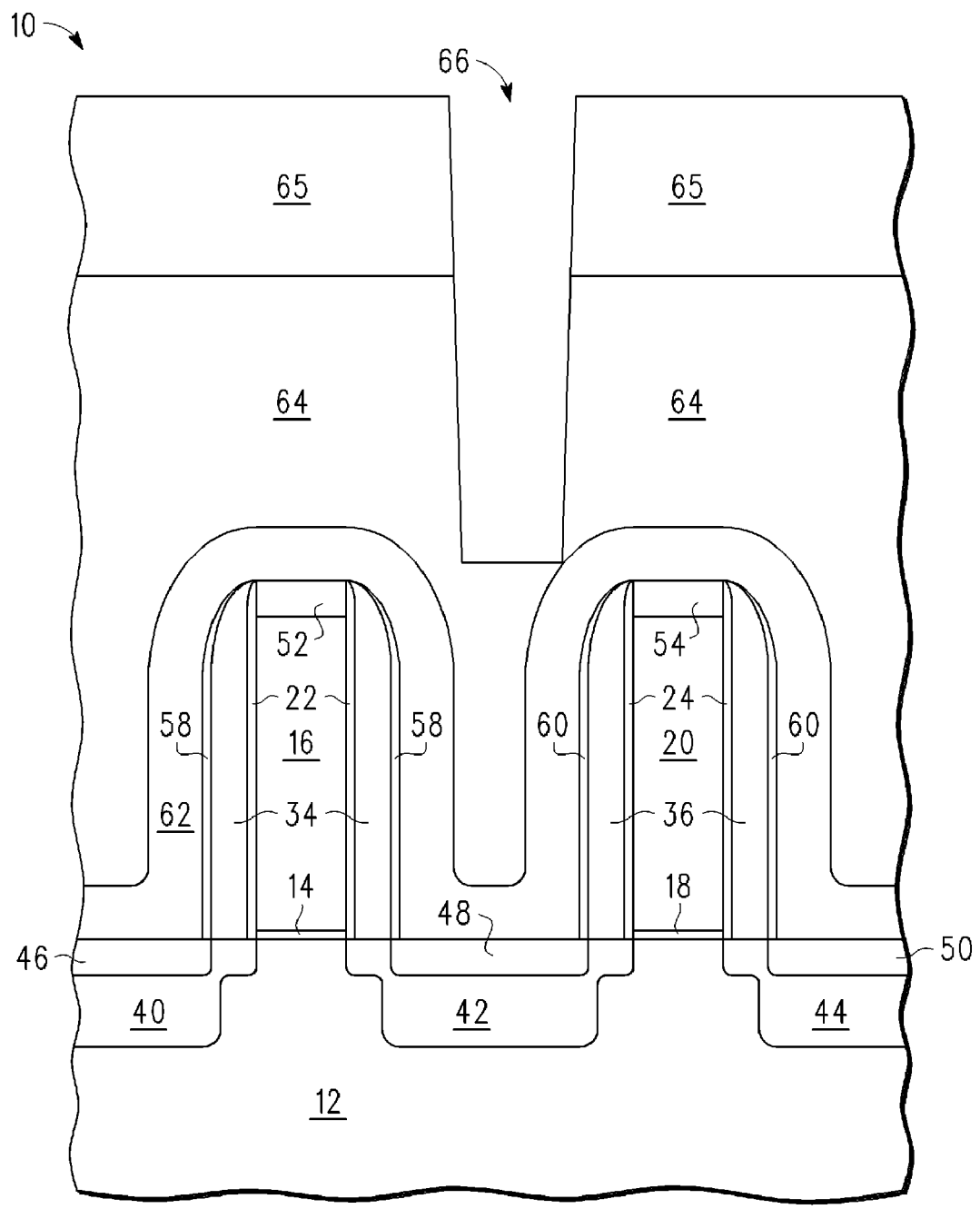
FIG. 10 is the semiconductor device structure of FIG. 9 at a subsequent stage in processing.

Shown in FIG. 10 is semiconductor device 10 after forming a patterned photoresist layer 65 over interlayer dielectric 64 and a partial etch of a via hole 66. Via hole 66 is patterned according to the opening in photoresist layer 65 shown in FIG. 10. This shows the etch at the stage at which via hole 66 has reached etch stop layer 62. This also shows that via hole 66 is not perfectly aligned to silicide region 48. Via hole is closer to gate electrode 20 than to gate electrode 16. In this example, misalignment is about 50 nm, which is about one sixth of the minimum pitch. A common characteristic of processes is that misalignment is between 10 and 20 percent of the minimum pitch of the gate electrodes. This etch may be a dry etch that is a combination of carbon, fluorine, and oxygen such as C4F8 or C4F6 and oxygen.

Figure 11:
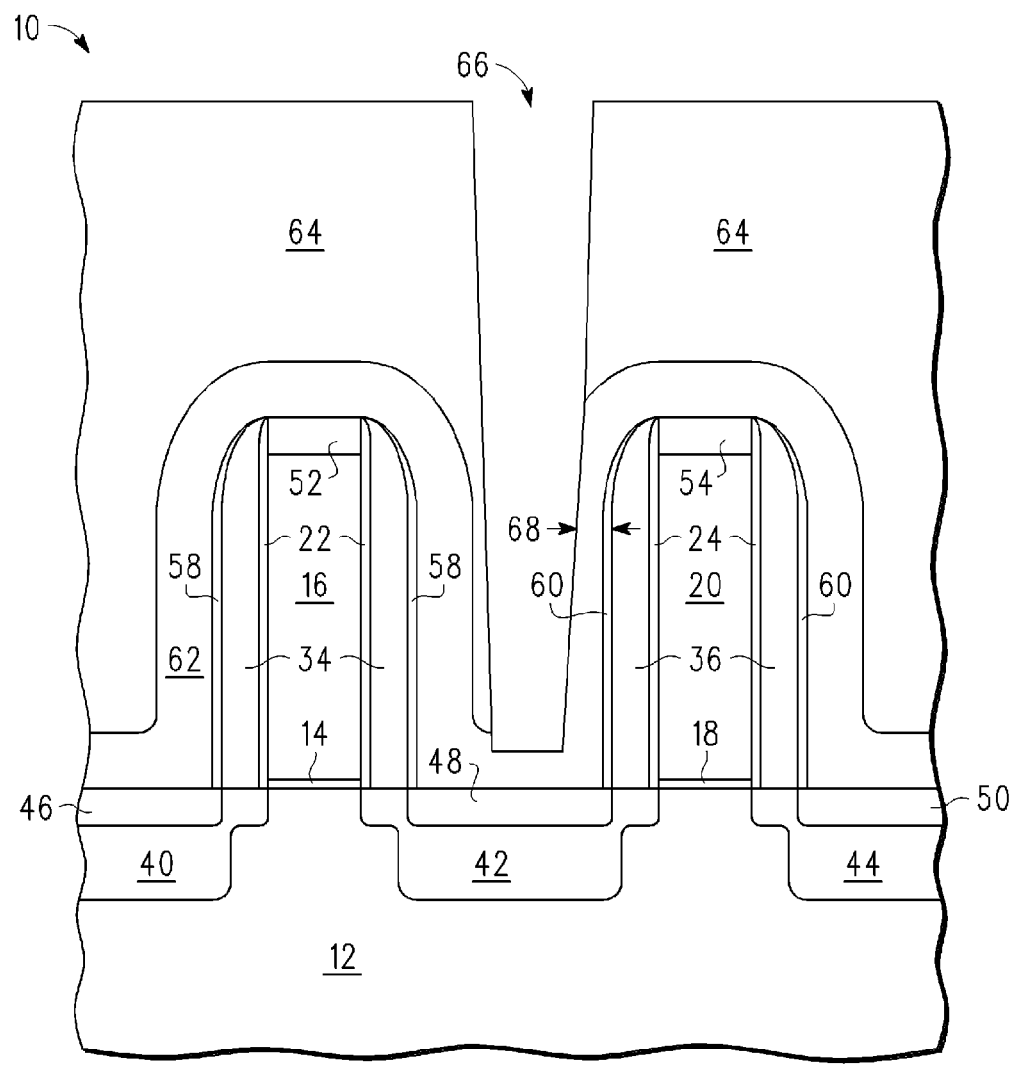
FIG. 11 is the semiconductor device structure of FIG. 10 at a subsequent stage in processing.

Shown in FIG. 11 is semiconductor device 10 after continuing the etch of via hole 66 to etch stop layer 62 and removing patterned photoresist layer 65. Although the etch of via hole 66 is an oxide etch, this etch also removes some nitride. Thus etch stop layer 62 is eroded along the side of gate electrode 20 to a distance 68 between via hole 66 and sidewall spacer 36. Distance 68 may be only a few nm, such as 10 nm or even less. Etch stop layer 62 performs its function of preventing the etching of via hole 66 through interlayer dielectric 64 from reaching silicide region 48.

Figure 12:
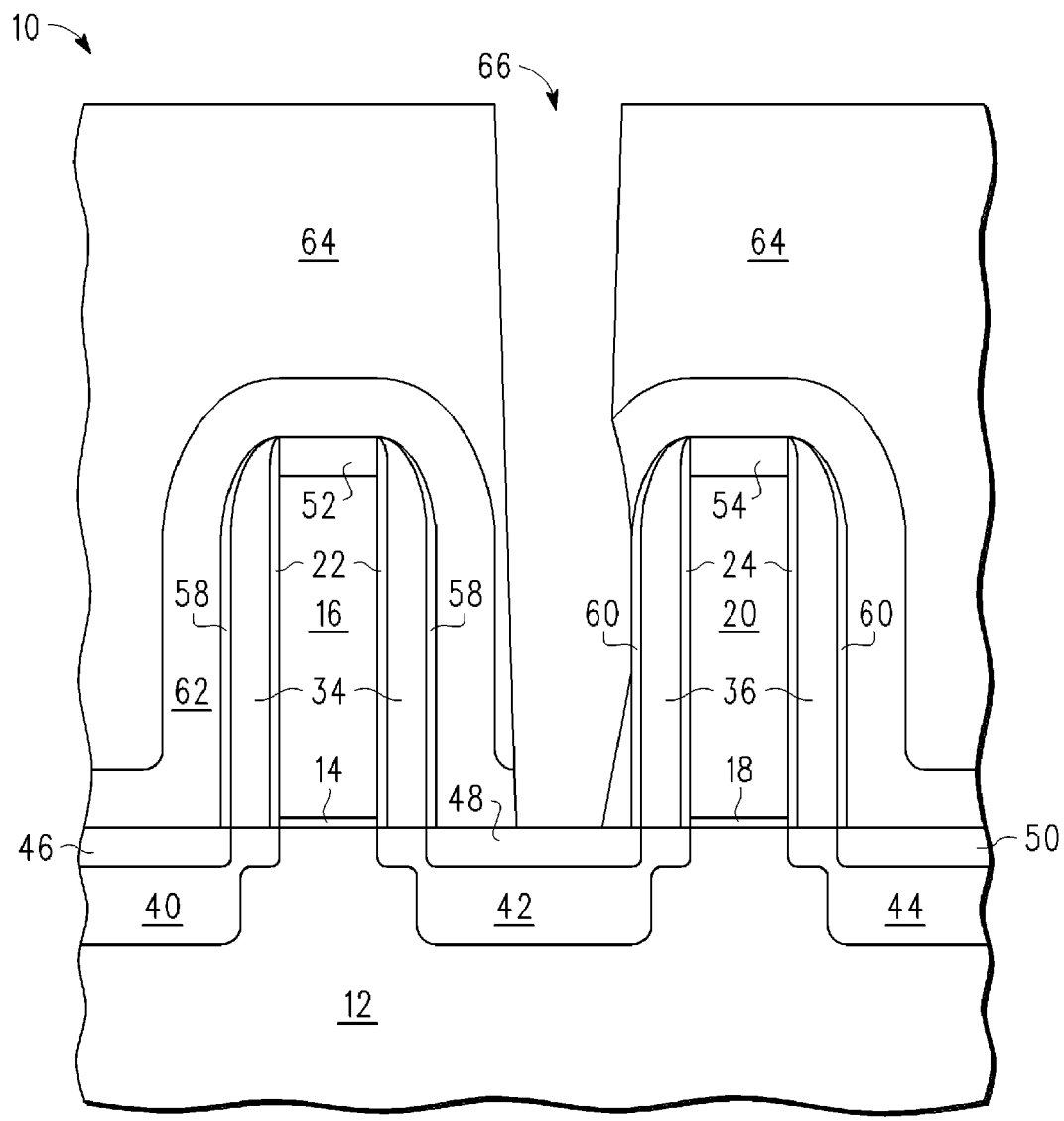
FIG. 12 is the semiconductor device structure of FIG. 11 at a subsequent stage in processing.

Shown in FIG. 12 is semiconductor device 10 after a nitride etch to complete via hole 66 so that silicide layer 48 is exposed. Because this is a nitride etch, etch stop layer 62 is greatly eroded and exposes sidewall spacer 60. Because sidewall spacer 60 has an etch characteristic that is highly selective to the etch that completes the formation of via hole 66, the nitride etch that completes the formation of via hole 66 does not reach sidewall spacer 36. If sidewall spacer 36 were exposed to the nitride etch, sidewall spacer 36 would be eroded. With sidewall spacer 60 acting as a barrier to the nitride etch, sidewall spacer 36 is protected and does not erode during the nitride etch. Even though the nitride etch is intended to be an anistropic etch, it has an isotropic element. An example of such an etch is a combination of fluorine and oxygen. One example is $CHF_3$ and $O_2$.

Figure 13:
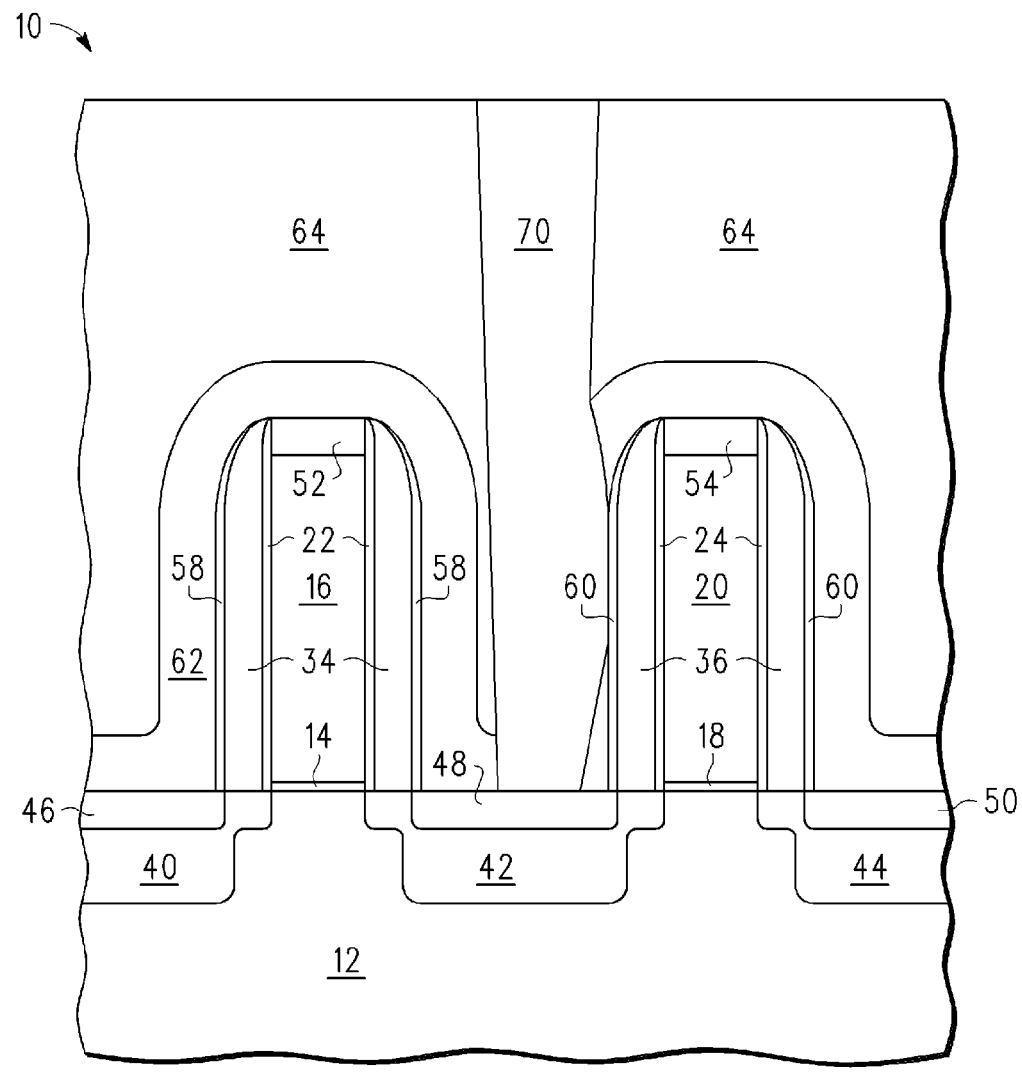
FIG. 13 is the semiconductor device structure of FIG. 12 at a subsequent stage in processing.

Shown in FIG. 13 is semiconductor device 10 after filling via hole with via 70. Via 70 may be primarily tungsten with a liner that is a barrier such as titanium nitride. Other barriers may also be used. One example of another barrier is tantalum nitride. Also other fill material may used such as copper. As seen in FIG. 13, via 70 does not penetrate into sidewall spacer 36 because via hole 66 ended at sidewall spacer 68. As seen in this FIG. 13, the addition of sidewall spacers 58 and 60 do not reduce the amount of contact area between via 70 and silicide 48. Thus, the presence of post-silicide sidewall spacer 60 being highly selective to the etch of etch stop layer 62 results in an improvement for the case of misalignment of via hole 66, but does not detrimentally effect semiconductor device 10 for the case where there is little or no misalignment.

By now it should be appreciated that there has been provided a method for forming a via. The method includes forming a gate electrode over a semiconductor substrate. The method further includes forming a source/drain region in the semiconductor substrate adjacent the gate electrode. The method further includes forming a silicide region in the source/drain region. The method further includes after forming the silicide region, forming a post-silicide spacer adjacent the gate electrode. The method further includes forming an interlayer dielectric layer over the gate electrode, the post-silicide spacer, and the silicide region. The method further includes forming a conductive via in the interlayer dielectric layer, extending to the silicide region. The method may be further characterized by the forming the post-silicide spacer comprising forming the post-silicide spacer over source/drain region. The method may further comprise prior to forming the silicide region, forming at least one pre-silicide spacer adjacent the gate electrode, wherein forming the post-silicide spacer comprises forming the post-silicide spacer adjacent the at least one pre-silicide spacer. The method may be further characterized by the forming the post-silicide spacer comprising forming a conformal insulating layer over the gate electrode and the suicide region and performing an anisotropic etch to remove a portion of the conformal insulating layer over the silicide region, wherein a remaining portion of the conformal insulating layer forms the post-silicide spacer. The method may further comprise forming an etch stop layer over the gate electrode, the post-silicide spacer, and the silicide region, wherein forming the interlayer dielectric layer comprises forming the interlayer dielectric layer over the etch stop layer, and wherein the etch stop layer is formed of a material that etches selectively to the post-silicide spacer. The method may be further characterized by the forming the conductive via in the interlayer dielectric layer comprising forming the conductive via in the interlayer dielectric extending through the etch stop layer to the silicide region. The method may be further characterized by at least a portion of the conductive via being in physical contact with at least a portion of the post-silicide spacer. The method may further comprise forming a second gate electrode on the semiconductor substrate, wherein the source/drain region is adjacent the gate electrode and the second gate electrode, and after forming the silicide region, forming a second post-silicide spacer adjacent the second gate electrode, each of the first and second post-silicide spacers over the source/drain region, wherein the conductive via is formed between the first and second post-silicide spacer. The method may be further characterized by a pitch between the gate electrode and the second gate electrode being at most approximately equal to a height of the gate electrode.

Also disclosed is a method for forming a via that includes forming a gate electrode over a semiconductor substrate. The method further includes forming at least one spacer adjacent the gate electrode and a source/drain region in the semiconductor substrate adjacent the gate electrode, wherein at least a portion of the source/drain region underlies the at least one spacer. The method further includes forming a silicide region in the source/drain region. The method further includes after forming the silicide region, forming a post-silicide spacer adjacent the at least one spacer and over the source/drain region. The method further includes forming an interlayer dielectric layer over the gate electrode, the at least one spacer, the post-silicide spacer, and the silicide region. The method further includes forming a conductive via in the interlayer dielectric layer, extending to the silicide region. The method may be further characterized by the forming the post-silicide spacer comprising forming a conformal insulating layer over the gate electrode, the at least one spacer, and the silicide region and performing an anisotropic etch to remove a portion of the conformal insulating layer over the silicide region, wherein a remaining portion of the conformal insulating layer forms the post-silicide spacer. The method may further comprise forming an etch stop layer over the gate electrode, the at least one spacer, the post-silicide spacer, and the silicide region, wherein forming the interlayer dielectric layer comprises forming the interlayer dielectric layer over the etch stop layer, and wherein the etch stop layer is formed of a material that etches selectively to the post-silicide spacer. The method may be further characterized by the forming the conductive via in the interlayer dielectric layer comprising forming the conductive via in the interlayer dielectric extending through the etch stop layer to the silicide region. The method may be further characterized by at least a portion of the conductive via being in physical contact with at least a portion of the post-silicide spacer. The method may further comprise forming a second gate electrode on the semiconductor substrate, wherein the source/drain region is adjacent the gate electrode and the second gate electrode, forming at least one spacer adjacent the second gate electrode, the at least one spacer being over the source/drain region, and after forming the silicide region, forming a second post-silicide spacer adjacent the at least one spacer adjacent the second gate electrode, each of the first and second post-silicide spacers over the source/drain region, wherein the conductive via is formed between the post-silicide spacer and the second post-silicide spacer. The method may be further characterized by a pitch between the gate electrode and the second gate electrode being at most approximately equal to a height of the gate electrode.

Described also is a method for forming a via that includes forming a gate electrode over a semiconductor substrate. The method further includes forming a pre-silicide spacer adjacent the gate electrode and a source/drain region in the semiconductor substrate adjacent the gate electrode, wherein at least a portion of the source/drain region underlies the pre-silicide spacer. The method further includes after forming the source/drain region and the pre-silicide spacer, forming a silicide region in the source/drain region. The method further includes after forming the silicide region, forming a conformal insulating layer over the gate electrode, the pre-silicide spacer, and the silicide region. The method further includes removing a portion of the conformal insulating layer over the silicide region, wherein a remaining portion of the conformal insulating layer forms a post-silicide spacer adjacent the pre-silicide spacer and over the source/drain region. The method further includes forming an interlayer dielectric layer over the gate electrode, the pre-silicide spacer, the post-silicide spacer, and the silicide region. The method further includes forming a conductive via in the interlayer dielectric layer, extending to the silicide region. The method may further comprise forming an etch stop layer over the gate electrode, the pre-silicide spacer, the post-silicide spacer, and the silicide region, wherein forming the interlayer dielectric layer comprises forming the interlayer dielectric layer over the etch stop layer, and wherein the etch stop layer is formed of a material that etches selectively to the post-silicide spacer. The method may be further characterized by the removing the portion of the conformal insulating layer comprising performing an anisotropic etch of the conformal insulating layer to expose the silicide region. The method may further comprise forming a second gate electrode on the semiconductor substrate, wherein the source/drain region is adjacent the gate electrode and the second gate electrode and forming a second pre-silicide spacer adjacent the second gate electrode, the second pre-silicide spacer being over the source/drain region, wherein forming the conformal insulating layer over the gate electrode, the pre-silicide spacer, and the silicide region comprises forming the conformal insulating layer over the gate electrode, the pre-silicide spacer, the second gate electrode, the second pre-silicide spacer, and the silicide region, wherein after removing the portion of the conformal insulating layer over the silicide region, a second remaining portion of the conformal insulating layer forms a second post-silicide spacer adjacent the second pre-silicide spacer and over the source/drain region, and wherein the conductive via is formed between the post-silicide spacer and the second post-silicide spacer.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, particular etchants were specified but others may be effective. Also other insulating materials may be used instead of oxide and nitride although there are benefits to being able to use commonly used materials for semiconductor manufacturing. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method for forming a via, the method comprising:
   forming a first gate electrode over a semiconductor substrate;
   forming a second gate electrode over the semiconductor substrate;
   forming a first spacer along a first side of the first gate electrode and a second spacer along a first side of the second gate and a source/drain region in the semiconductor substrate between the first gate electrode and the second gate electrode, wherein a first portion of the source/drain region underlies the first spacer and a second portion underlies the second spacer;
   forming a silicide region in the source/drain region;
   after forming the silicide region, forming a first post-silicide spacer adjacent the first spacer and over the source/drain region and forming a second post silicide spacer adjacent the second spacer, wherein the first and second post-silicide spacers have an etch characteristic and are not greater than 20 nm thick;
   forming a conformal layer over the first and second post-silicide spacers, the first and second gate electrodes, and the silicide region, wherein the conformal layer has an etch characteristic different from the etch characteristic of the first and second post-silicide spacers;
   forming an interlayer dielectric layer over the conformal layer, wherein the interlayer dielectric has an etch characteristic different from the etch characteristic of the conformal layer;
   etching, using a first chemistry, a hole over the silicide region and in the interlayer dielectric, wherein the etching stops without penetrating through the conformal layer and the hole at the conformal layer is exclusively over the silicide layer, and erosion of a portion of the conformal layer occurs laterally to the hole in a region between the hole and the first gate electrode;
   etching, using a second chemistry, the conformal layer to extend the hole through the conformal layer and exposing the first post silicide spacer in the region between the hole and the first gate electrode and leaving a portion of the conformal layer on the silicide layer between the hole and the first gate; and
   forming a conductive via in the hole, extending to the silicide region.

2. The method of claim 1, wherein forming the first post-silicide spacer comprises:
   forming a conformal insulating layer over the gate electrode, the at least one spacer, and the silicide region; and
   performing an anisotropic etch to remove a portion of the conformal insulating layer over the silicide region, wherein a remaining portion of the conformal insulating layer forms the post-silicide spacer.

3. The method of claim 1, wherein at least a portion of the conductive via is in physical contact with at least a portion of the first post-silicide spacer.

4. The method of claim 1, wherein a pitch between the first gate electrode and the second gate electrode is at most approximately equal to a height of the gate electrode.

* * * * *